US005237738A

United States Patent [19]

Purcell et al.

[11] Patent Number: 5,237,738

[45] Date of Patent: Aug. 24, 1993

[54] METHOD OF MANUFACTURING A CONTAINMENT VESSEL FOR USE WITH A PULSED MAGNET SYSTEM

[75] Inventors: John R. Purcell, San Diego; Sibley C. Burnett, Cardiff by the Sea; Lewis R. Creedon, San Diego, all of Calif.

[73] Assignee: Advanced Cryo Magnetics, Inc., San Diego, Calif.

[21] Appl. No.: 805,208

[22] Filed: Dec. 10, 1991

Related U.S. Application Data

[62] Division of Ser. No. 669,804, Mar. 15, 1991, Pat. No. 5,148,137, which is a division of Ser. No. 439,422, Nov. 20, 1989, Pat. No. 5,019,247.

[51] Int. Cl.[5] .............................................. H01L 39/24

[52] U.S. Cl. .......................................... 29/599; 29/605

[58] Field of Search ..................... 29/599, 602.1, 605, 29/607; 209/213, 223.1, 224, 232; 335/216, 301; 174/15.4, 125.1; 210/222; 62/51.3

[56] References Cited

U.S. PATENT DOCUMENTS 3,005,117 10/1961 Buchhold .............................. 310/40
3,133,144 5/1964 Cottingham et al. ................. 174/15
3,360,692 12/1967 Kafka ................................. 317/123
3,503,504 3/1970 Bannister ........................... 209/223
3,694,914 10/1972 Aupoix et al. .................... 29/599 X
4,272,365 6/1981 Ries et al. ........................ 209/223 R
4,609,109 9/1986 Good .................................. 209/636
4,640,005 2/1987 Mine et al. ............................ 29/599
4,694,269 9/1987 Burnett et al. ...................... 335/216
4,702,825 10/1987 Selvaggi et al. .................... 209/224
4,707,676 11/1987 Saitou et al. ........................ 335/216
4,726,199 2/1988 Takano et al. ......................... 62/505
4,743,880 5/1988 Breneman et al. .................. 335/301
4,768,008 8/1988 Purcell et al. ....................... 335/216
4,784,760 11/1988 Good et al. ...................... 209/223.1
4,819,450 4/1989 Miller ................................ 62/514 R
4,822,772 4/1989 Huson ................................ 335/216

*Primary Examiner*—Joseph M. Gorski
*Attorney, Agent, or Firm*—Fitch, Even, Tabin & Flannery

[57] ABSTRACT

A method of manufacturing a helium containment vessel for use with a pulsed superconducting magnetic separator system is described. The containment vessel includes a superconducting coil positioned within the cryogenic containment vessel for providing a magnetic field. The containment vessel includes a relatively thin metallic inner tube for holding liquid helium and the coil. The containment vessel also includes a relatively thick outer tube encompassing the inner tube with a relatively rigid insulative spacer positioned between the inner and outer tubes so that the tubes are not in contact with each other. The outer tube is predominantly metallic and has at least one joint formed of insulative material to prevent the outer tube from forming a low electrical resistance loop.

5 Claims, 6 Drawing Sheets

10
12
14
16
20
22
26
28
30
32
33

METHOD OF MANUFACTURING A CONTAINMENT VESSEL FOR USE WITH A PULSED MAGNET SYSTEM

This application is a divisional application of U.S. patent application Ser. No. 07/669,804, filed Mar. 3, 1991, now U.S. Pat. No. 5,148,137, which is a divisional application of U.S. patent application Ser. No. 07/439,422, filed Nov. 20, 1989, now U.S. Pat. No. 5,019,247.

This invention relates to apparatus for providing a magnetic field and, more particularly, to a method of manufacturing a containment vessel for use with a magnet system having a superconductive coil, the current in which is ramped up and down.

BACKGROUND OF THE INVENTION

Magnet systems incorporating superconductive coils, the current in which is ramped up and down (pulsed), have application in such diverse fields as material separation and energy storage. For example, a magnetic separator can be employed to process kaolin (a white clay) that is used to provide shiny veneer on paper. Kaolin as mined has trace quantities of titanium dioxide ($TiO_2$) which gives the kaolin a yellow cast. The ($TiO_2$) is paramagnetic whereas the kaolin is nonmagnetic. The granular kaolin to be processed is mixed with water to form a slurry which is directed to the working bore of the magnetic separator packed with stainless steel wool which, in the presence of the intense magnetic field provided by the coil, attracts and holds the titanium dioxide. With time, the steel wool becomes saturated with the $TiO_2$ and the coil current must be ramped down to permit flushing of the $TiO_2$ from the steel wool. The current must then be ramped up again to effect separation. Ramping times can be in the order of 60 seconds and the current in the coil may be in the order of 1000 amperes.

Conventional superconductive material has a critical temperature only slightly above the boiling point of liquid helium. Magnet systems typically maintain the coil in its superconductive state by placing the coil in a helium containment vessel made of stainless steel to provide a vacuum seal and having sufficient thickness to withstand the mechanical forces applied to the vessel. Such a helium vessel operates satisfactorily in magnet systems used for magnetic resonance imaging (MRI) because, in that application, the coil current is constant to provide a continuous homogeneous magnetic field. In a pulsed magnet system, with the magnet field being frequently collapsed and then reestablished, significant resistive heating occurs in the helium vessel due to the generation of eddy currents. To maintain the coil in its superconductive state, large capacity refrigeration equipment is required, and the major cost of operation of a pulsed magnet system can be the cost of running the refrigeration equipment.

U.S. Pat. No. 3,360,692 to Kafka is directed to a magnetic device for providing high-intensity fields of short duration for use in, for example, plasma confinement. With reference to FIGS. 3 and 4 of that patent, a superconductor 24 is embedded between two adjacent metallic jackets 15, each of which has an axial slit 25 to prevent the jacket from forming a short circuit. The conductor 24 is spaced from the jacket by layers of insulation 26. The slits 25 also serve as conduits for coolant, see Col. 3, 1. 72 through Col. 4, 1. 59.

U.S. Pat. No. 4,609,109 to Good shows a magnetic separator. The thrust of the patent is that certain economies can be achieved using oval shaped coils as opposed to circular coils, Col. 2, 11. 24–60.

U.S. Pat. No. 4,702,825 to Selvaggi et al. teaches a magnet separator including a superconductive coil. The current is ramped up and down to permit periodic flushing of trapped containments from the bore of the magnetic which accepts canisters packed with a matrix of magnetic stainless steel wool. The magnet is supported at both ends so that it will take side loads as well as compressive loads.

U.S. Pat. No. 4,707,676 to Saitou et al. shows a magnet system in which the outer peripheral portion of the cryostat is thickened so that it serves as a magnetic shield.

U.S. Pat. No. 4,768,008 to Purcell et al. illustrates a magnet system in which the inner wall of the vacuum vessel has a relatively thin metallic portion backed up by a non-metallic support portion with the result being that the first wall is relatively transparent to the gradient field used in MRI.

SUMMARY OF THE INVENTION

Among the several aspects and features of the present invention may be noted the provision of an improved pulsed magnetic system. The system has greatly reduced operating costs because refrigeration equipment required is relatively small and its operating costs are much lower, resulting from decreased resistive heating of the helium vessel. The vessel provides a vacuum seal as well as sufficient structural integrity to withstand the mechanical forces applied to the vessel. The pulsed magnet system of this invention is reliable in use, has long service life, and is relatively easy and economical to manufacture. Other aspects and features of the invention will be, in part, apparent and, in part, pointed out in the following specification and in the accompanying drawings.

Briefly, the pulsed magnet system, in the form of a magnetic separator, includes a vacuum vessel defining an opening for entrance of the material the components of which are to be separated. A cryogenic containment vessel assembly is positioned within the vacuum vessel, and a superconducting coil is disposed within the vessel assembly for providing a magnetic field to cause the separation of the components of the material. The vessel assembly includes a helium vessel having a relatively thin metallic inner tube for holding liquid helium and the coil. The helium vessel also includes a relatively thick outer tube encompassing the inner tube with a relatively rigid spacer of insulation separating the inner and outer tubes so that the tubes are not in contact with each other. This outer tube is predominantly metallic but has at least one joint formed of insulative material to prevent the outer tube from forming a low electrical resistance loop. The inner tube provides a vacuum seal while the outer tube provides structural support for the inner tube so that eddy current losses resulting from ramping of the current to the coil are reduced.

The method of manufacturing the containment vessel in accordance with the present invention includes a) welding the inner wall of the inner tube to the end walls of the inner tube and installing a temporary outer wall to the end walls of the inner tube to close off the cavity defined by the inner tube;

b) pressurizing said cavity and checking for leakage at the welds;

c) assembling the inner and end walls of the outer tube about the inner tube with components of said spacer means between the incipient tubes;
d) removing the temporary outer wall of said inner tube to open the cavity of the inner tube;
e) winding a coil of superconducting material in said cavity;
f) welding the outer wall of the inner tube to the end walls of the inner tube; and
g) attaching the outer wall of the outer tube to the end walls of the outer tube with components of said spacer means between said outer walls.

Figure 2:
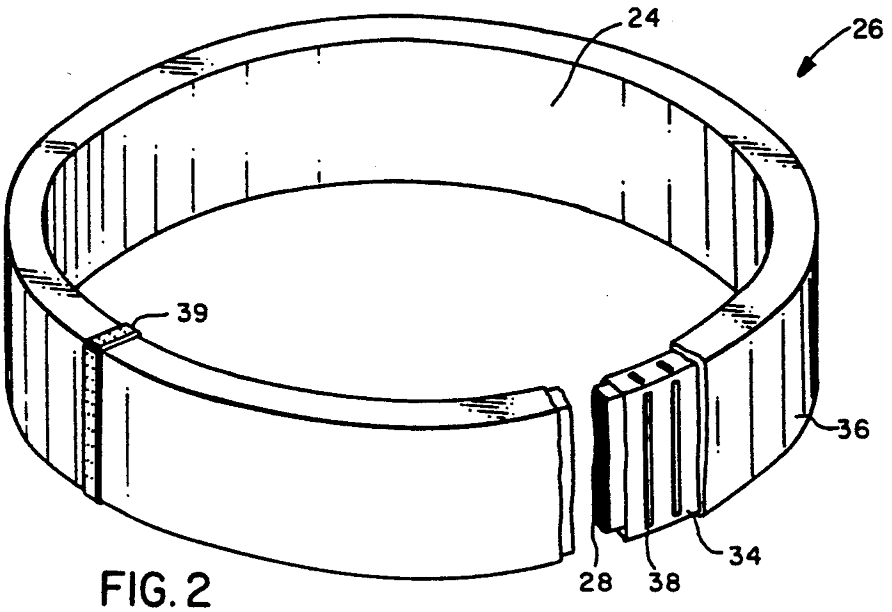
Figure 3:
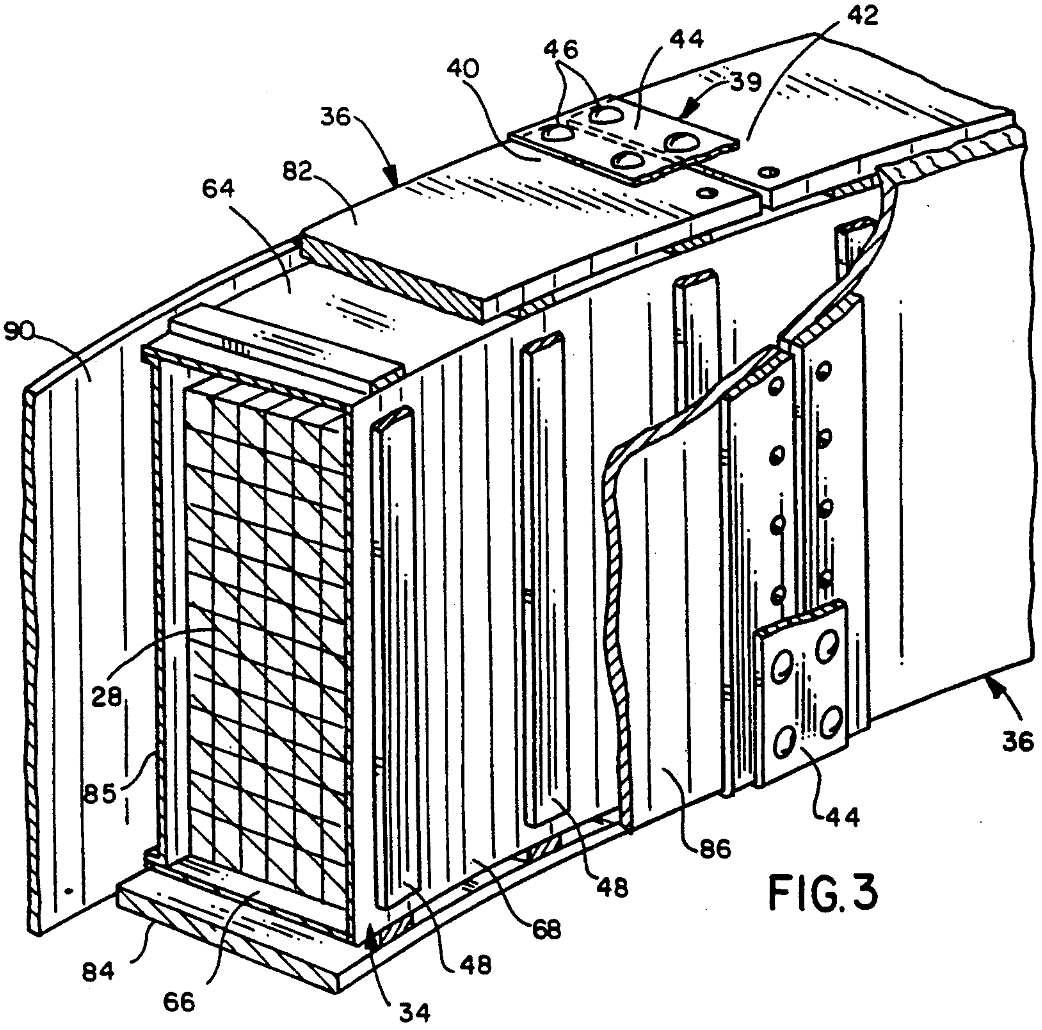
Figure 4:
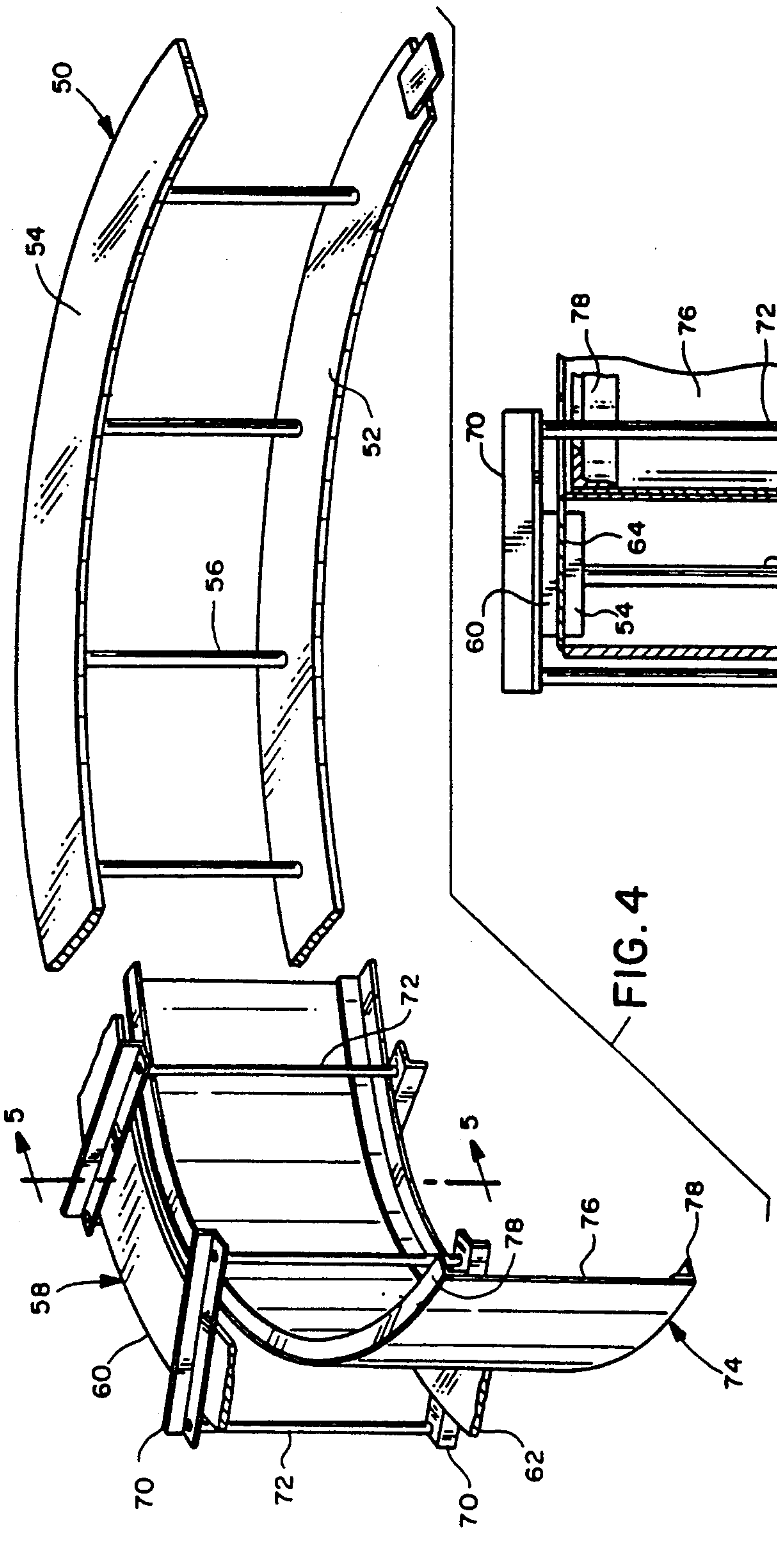
Figure 5:
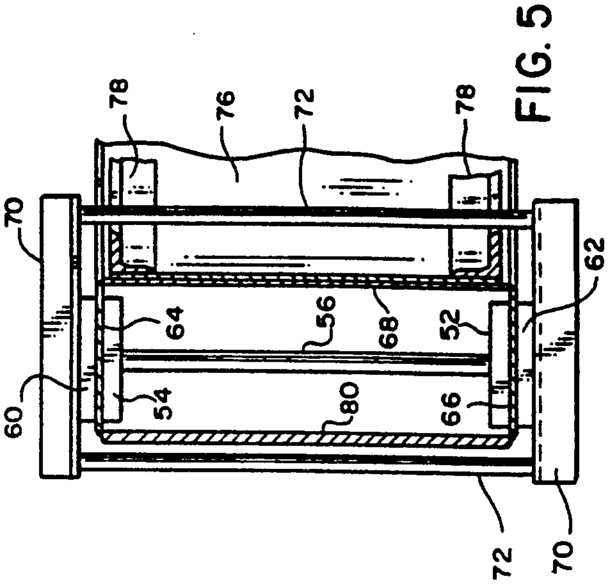
Figure 11:
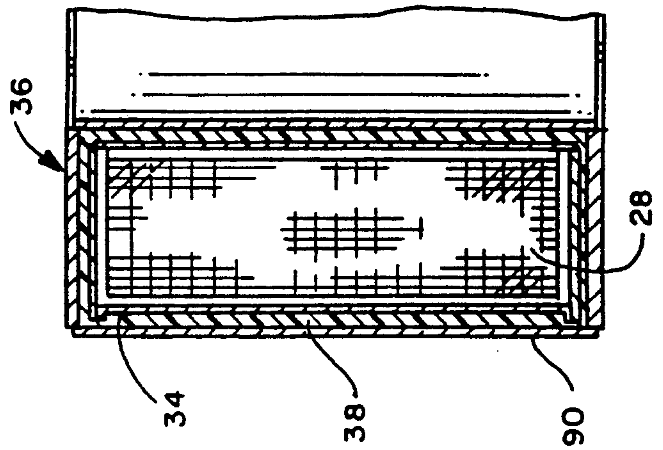
Figure 12:
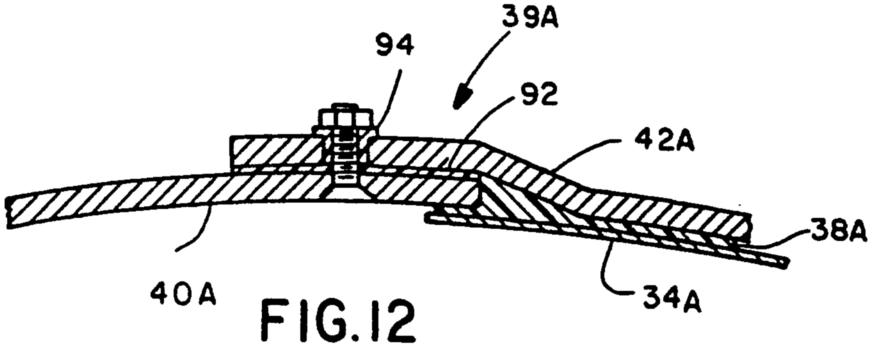
Figure 13:
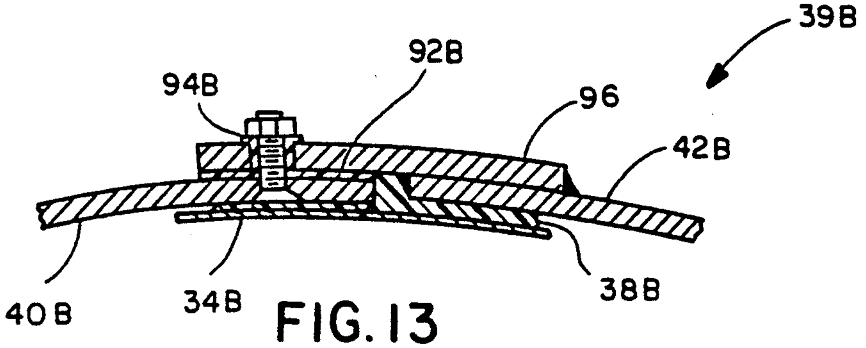
Figure 14:
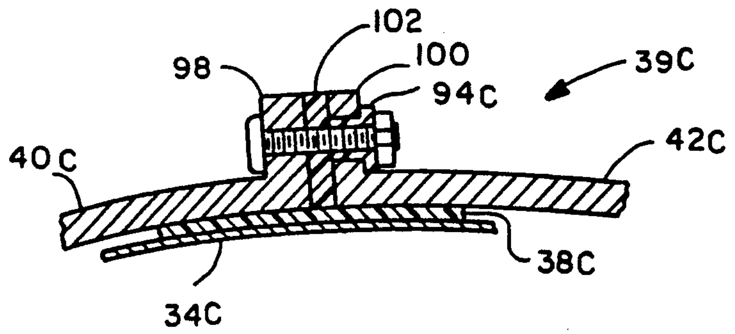

FIG. IA is a perspective view, with certain components broken away to expose underlying components, of a portion of a helium vessel positioned inside a vacuum vessel and spaced therefrom by a heat shield;

FIG. 2 is a perspective view of the helium containment vessel holding a superconducting coil, with portions of components broken away to expose underlying components;

FIG. 3 is an enlarged perspective view of a portion of the helium containment vessel of FIG. 2 again with parts of outer components removed to show inner components;

FIG. 4 is a perspective view of tooling components for use in assembly the helium containment vessel;

FIG. 5 is a sectional view taken generally along line 5—5 of FIG. 4;

FIGS. 6-11, similar to FIG. 5, illustrate a sequence of manufacturing steps for the helium containment vessel; and FIGS. 12-14 are sectional views showing alternative embodiments of insulative joints in the outer tube of the helium vessel.

Corresponding reference numerals indicate corresponding components throughout the several views of the drawings.

DESCRIPTION OF THE PREFERRED EMBODIMENT

Figures 1, 1A:
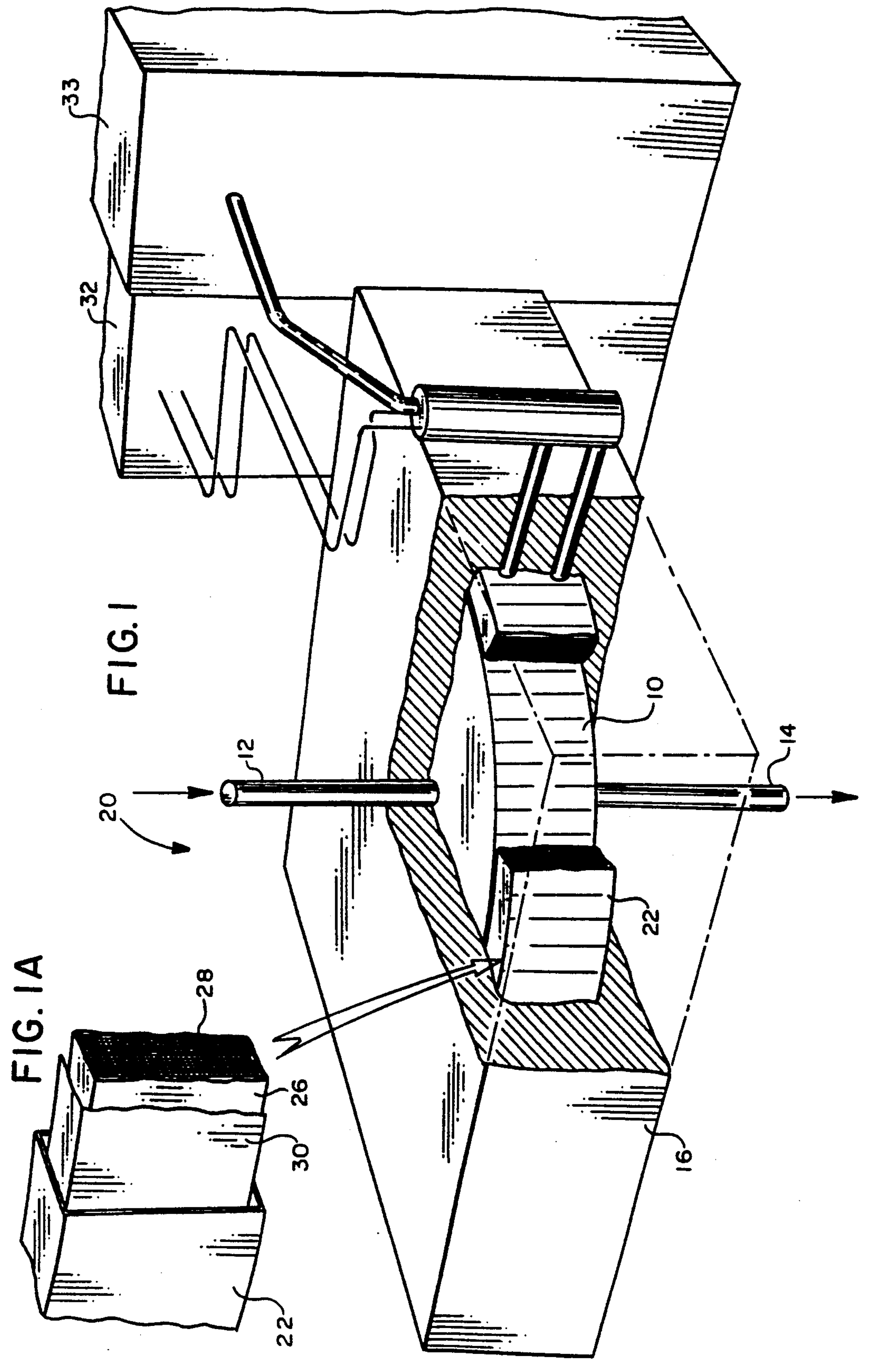
FIG. 1 is a perspective view of a pulsed magnet system embodying various aspects of the present invention, including a low loss helium containment vessel.

Referring now to the drawings, a pulsed magnet system in the form of a magnetic separator is generally indicated by reference numeral 20 in FIG. 1. The magnetic separator 20, which functions to divide a more magnetizable component of a material from a less magnetizable component of the material, includes a vacuum vessel 22 defining an opening 24 (FIG. 2) through which the material, the components of which are to be separated, passes. More specifically, a separation vessel 10 is shown disposed in the opening 24. The separation vessel can be filled with magnetic stainless steel wool for attracting and holding the more magnetizable component of the material in..the presence of an intense magnetic field. The vessel 10 is provided with an entrance pipe 12 for entry of the fluid to be processed carrying the material, and with an exit pipe 14 for the fluid carrying the less magnetizable component of the material.

As shown in FIG. IA, a cryogenic containment vessel assembly is positioned within the vacuum vessel. This assembly includes a helium vessel 26 holding a superconducting coil 28 made up of a great number of turns of superconductive wire along with helium liquid and helium gas for maintaining the temperature of the coil 28 below its critical temperature. The cryogenic containment vessel assembly may also include at least one thermal shield between the helium vessel 26 and the vacuum vessel 22, which could be in the form of a liquid nitrogen temperature shield 30.

Referring again to FIG. 1, the magnetic separator 20 also includes an electric power supply 32 connected to the coil 28 for ramping the current in the coil 28 up and down to selectively increase and decrease the intensity of the magnetic field provided by the coil. Furthermore the separator has a refrigeration system 33 interconnected with either the helium vessel and/or the nitrogen vessel (or temperature shield) for receiving coolant in its gaseous state and, after cooling, returning the reliquified coolant to the appropriate vessel. The connections for the electrical power supply to the coil and for the refrigeration system to the helium vessel and/or nitrogen vessel are well known to those of skill in the art and do not need to be further discussed here.

The coil 28, along with the various vessels, may be positioned within an iron bunker 16 which functions as a low permeability magnetic flux return path. This bunker, which could have a thickness of 12 inches or more, also serves as a secondary containment shield in the highly unlikely event that the liquid coolant was rapidly heated beyond its liquification temperature.

The helium vessel of a magnet system including a superconducting coil is required to provide a vacuum seal and to provide sufficient structural integrity to withstand the forces occasioned by the application of the vacuum, and the weight of the coil, the liquid helium, and the helium vessel. Heretofore these requirements were met by fabricating the helium vessel of relatively thick wall stainless steel plates which were welded together. When such a helium vessel configuration is used in an application where the coil current is frequently ramped up and down, the collapse and regeneration of the magnetic field results in relatively large eddy currents because the thick wall stainless steel forms a complete loop, and the induced current is an inverse function of the resistance of the loop. These eddy currents result in resistive heating of the helium vessel with the heat causing coolant boiloff. The refrigeration system must then reliquify the gas and return it to the appropriate vessel.

Referring now FIGS. 2 and 3, the helium vessel 26 of the present invention significantly reduces resistive heating and therefor reduces refrigeration requirements. Vessel 26 includes a relatively thin metallic inner tube 34, preferably of stainless steel, for holding the coil 28 and the liquid and gaseous helium and for providing the vacuum seal. This inner tube has a wall thickness of only about 7 to 10 percent of that of a conventional helium vessel so the inner tube is unable to provide the requisite structural integrity. However vessel 26 also includes a relatively thick outer tube 36 encompassing the inner tube, and a relatively rigid insulative spacer 38 sandwiched between the inner and outer tubes for transmitting loads applied to the inner tube to the outer tube, as well as to render the inner tube electrically isolated from the outer tube. The outer tube 36 is predominantly metallic, preferably stainless steel, but has at least one joint 39 formed of insulative material to preclude the outer tube from forming a low electrical resistance loop.

As best shown in FIG. 3, the outer tube 36 has a first end 40 of metallic material and a second end 42 of metallic material which is spaced from and does not overlap the first end. The joint 39 includes a seal plate 44 of insulation, such as G-10, overlapping both ends 40, 42 and fastened to both ends by suitable fasteners 46. The spacer 38 between the inner and outer tubes includes a number of spaced battens 48, also preferably of G-10, with the interstices between the tubes and the battens occupied by an epoxy fill.

Tooling for use in fabricating the helium vessel 26 is best shown in FIGS. 4 and 5. The tooling includes an interior clamp plate assembly 50 including a circular lower plate 52, an identical upper plate 54, and a plurality of regularly spaced vertical standoffs 56 holding the upper and lower plates in aligned, vertically spaced relationship. The interior clamp assembly cooperates with an exterior clamp assembly 58 including an upper plate 60 and a lower plate 62 to hold in spaced aligned relationship first and second end walls 64 and 66, respectively, of the inner tube 34 in preparation for their joining by welding to an inner peripheral wall 68 of the inner tube. The exterior clamp assembly also includes spaced sets of upper and lower angled brackets 70 releasably connected by threaded studs 72 with associated nuts to hold the components assembled. A winding support 74 including an annular winding plate 76 which extends vertically between upper and lower angled supports 78, is employed to back up, or support, the inner peripheral wall 68 during winding of the coil 28. The winding support 74 may be mounted on a conventional winding table (not shown). The various plates of the tooling necessary for manufacture of a typical 100 inch diameter helium vessel can have thicknesses in the range of 3/16 to ½ inch while the walls forming the inner tube could be of 0.028 inch thick stainless steel.

Figure 7:
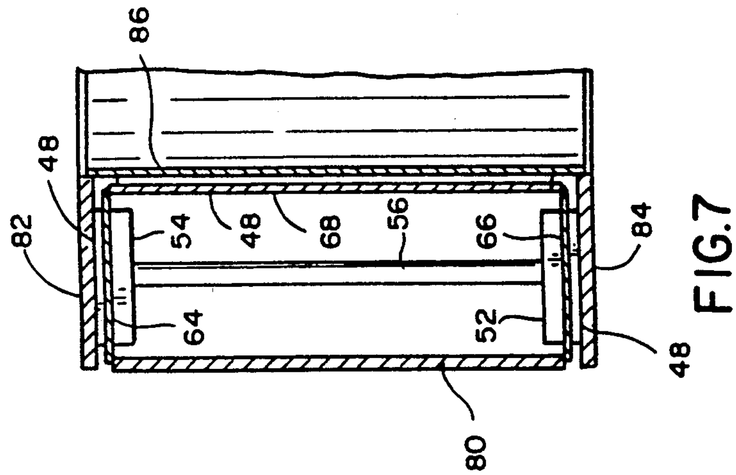
Figure 6:
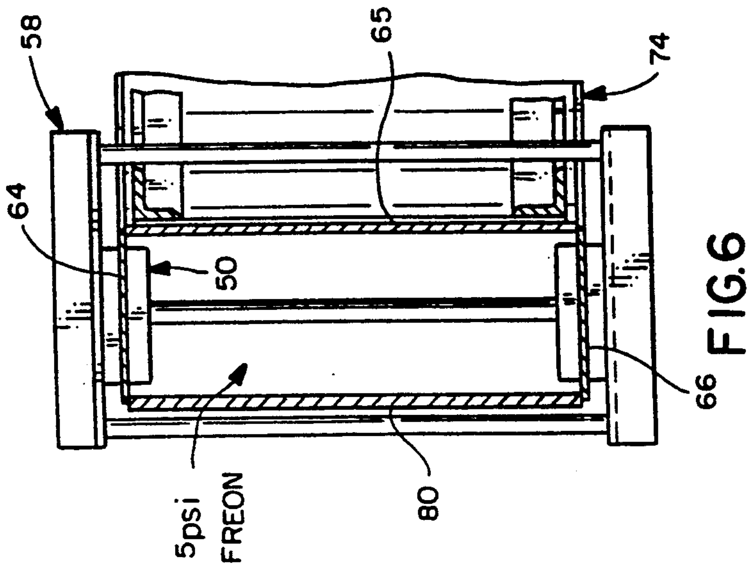

A relatively thick temporary outer peripheral wall 80 is then welded to the distal ends of the first and second end walls 64, 66 of the inner tube to close off the cavity defined by the inner tube so that the cavity can be pressurized to enable leak detection at the welds between the first and second end walls and the inner peripheral wall, as shown in FIG. 6. The exterior clamp assembly 58 can then be disassembled. Next, as shown in FIG. 7, the partially completed outer tube 36 made up of first end wall 82, second end wall 84 and inner peripheral wall 86, welded to the first and second end walls, is positioned to overlie corresponding components of the inner tube with the spaced battens 48 between the two partially completed tubes. The first and second walls 82, 84 may have thicknesses of over 0.4 inch while the inner peripheral wall 86 could have a thickness of over 0.3 inch.

Figure 8:
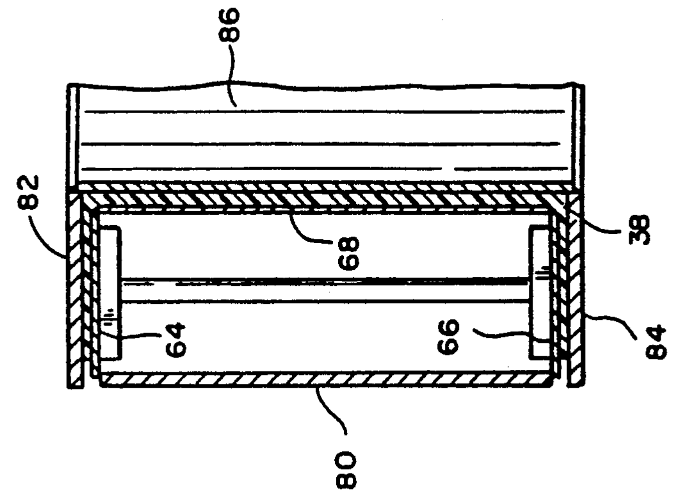
Figure 9:
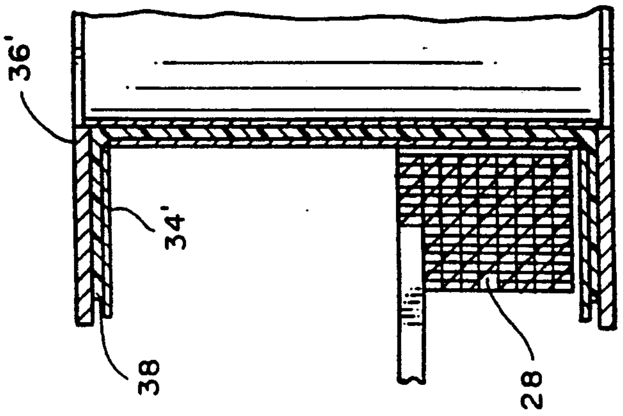

Referring to FIG. 8, the spaces between the incipient inner and outer tubes 34', 36' and the battens 48 are next filled by a vacuum impregnation of epoxy to seal and epoxy flood the insulating cavity thereby forming the complete spacer 38 as it extends between the partially completed inner and outer tubes. The temporary outer wall 80 may then be removed by grinding away the welds holding that temporary wall to the first and second walls 64, 66 of the inner tube. Next the inner tooling assembly 50 is removed, and the superconducting coil 28 is wound in the cavity of the inner tube 34, as shown in FIG. 9.

Figure 10:
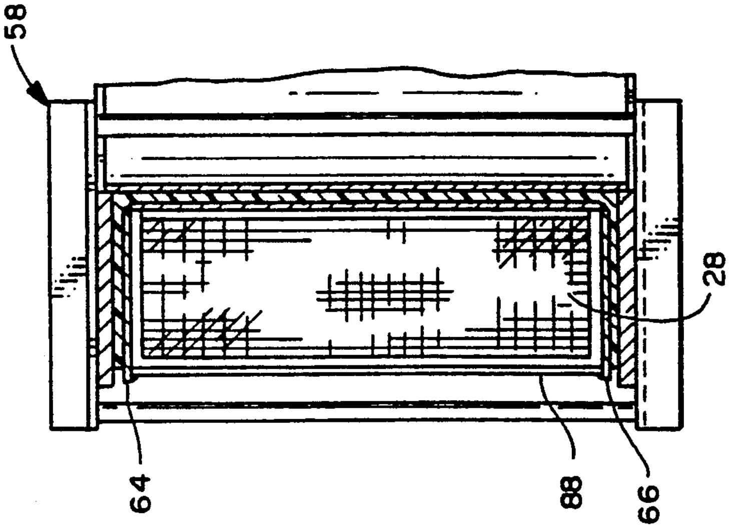

Referring to FIG. 10, the next step in the fabrication of the helium vessel 26 is the welding of the permanent outer peripheral wall 88 of the inner tube 4 to the ends of the first and second end walls 64, 66. Next the cavity is pressurized to check for leaks at these new welds. Referring to FIG. 11, the outer peripheral wall 90 of the outer tube 36 is welded to the ends of the first and second end walls of the partially completed outer tube. Battens 48 are again employed to maintain spaced the corresponding walls of the inner and outer tube, and the interstices between the battens are filled using the epoxy flood. The outer peripheral wall 88 of the inner tube may be of 0.028 inch thick stainless steel while the outer peripheral wall of the outer tube may be 3/16 inch thick stainless steel.

As a method of manufacturing a helium containment vessel 26, the present invention includes several steps.

a) The inner peripheral wall 68 of the inner tube 34 is welded to the end walls 64, 66 of the inner tube and a temporary outer wall 80 is installed to close off the cavity defined by the inner tube;
b) The cavity is pressurized to check for the welds;
c) The inner and end walls 86, 82 and 84 of the outer tube 36 are assembled about the inner tube with the battens 48 between the incipient tubes;
d) The temporary outer wall 80 of the inner tube is removed to open the cavity of the inner tube;
e) A coil 28 of superconducting material is wound in the cavity;
f) The outer wall 88 of the inner tube is welded to the end walls of the inner tube; and
g) The outer wall 90 of the outer tube is attached to the end walls of the outer tube with components of the spacer means between the respective outer walls.

FIGS. 12–14 show alternative embodiments of the insulative joint 39 (best shown in FIG. 3) of the outer tube 36. A simple lap point 39A is shown in FIG. 12 in which the outer tube second end 42A has a bend resulting in an overlap of ends 40A and 42A. An insulative layer 92 is provided between the ends, and an insulative sleeve 94 with an upper flange lines the fastener aperture in the end 42A with the cumulative result being that the ends do not form an electrically conductive path.

FIG. 13 shows a joint 39B similar to joint 39A. However, rather than providing a bend to cause an offset in second end 42A, the second end 42B includes an arm 96 overlapping first end 40B and welded to the remainder of the second end 42B.

A clamping joint 39C is shown in FIG. 14 in which the ends 40C, 42C have upturned facing terminals 98, 100, respectively. A layer of insulation 102 spaces the terminals and the aperture in one terminal is lined with an insulative sleeve 94C.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A method of manufacturing a helium containment vessel for use in a magnetic separator comprising the following steps:

(a) welding an annular inner wall (68) to a first annular end wall (64) and a second annular end wall (66), thereby forming a cavity bounded by said walls, and then installing a temporary annular outer wall (80) to the first annular end wall (64) and the second annular end wall (66), thereby closing off said cavity, and thereby forming a temporary tube; then (b) pressurizing the cavity and checking for leakage from the cavity; then (c) forming an exterior inner wall (86), a first exterior end wall (82) and a second exterior end wall (84) about the temporary tube from a plurality of arcuate segments, and forming an insulate joint (39) where each of said arcuate segments meet, while interposing an insulative spacer means (48) between the temporary tube, and the exterior inner wall (86), the first exterior end wall (82) and the second exterior end wall (84); the (d) removing the temporary annular outer wall (80) of the temporary tube, thereby opening the cavity; then (e) winding a coil (28) of superconducting material in the cavity; then (f) welding an annular outer wall (88) to the first annular end wall (64) and the second annular end wall (66), thereby forming an interior tube; and then (g) forming an exterior outer wall (90) from an outer arcuate segment and attaching said exterior outer wall to the first exterior end wall (82) and the second exterior end wall (84) while interposing the insulative spacer means (48) between the annular outer wall (88) and the exterior outer wall (90), and forming an insulative joint where respective ends of the outer arcuate segment meet, thereby forming an exterior tube, said exterior outer wall (90), exterior inner wall (86), first exterior end wall (82) and second exterior end wall (84) being thicker than the annular outer wall (88), annular inner wall (68), first annular end wall (64) and second annular end wall (66), respectively.

2. The method of manufacturing a helium containment vessel as set forth in claim 1 including installing the temporary annular outer wall to the first and second annular end walls by welding the temporary annular outer wall to the first and second annular end walls.

3. The method of manufacturing a helium containment vessel as set forth in claim 2 including removing the temporary annular outer wall by grinding away the welds holding the temporary wall to the first and second annular end walls.

4. The method of manufacturing a helium containment vessel as set forth in claim 1 wherein the temporary annular outer wall installed to the first and second annular end walls has a wall thickness greater than the wall thickness of the first and second annular end walls.

5. The method of manufacturing a helium containment vessel as set forth in claim 1 wherein the step of winding a coil of superconducting material in said cavity further includes supporting the annular inner wall with an annular winding plate during winding of the coil.

* * * * *